US012422868B2

(12) United States Patent
Tung et al.

(10) Patent No.: US 12,422,868 B2
(45) Date of Patent: Sep. 23, 2025

(54) LIQUID LEVEL CONTROLLING APPARATUS

(71) Applicants: Inventec (Pudong) Technology Corp., Shanghai (CN); Inventec Corporation, Taipei (TW)

(72) Inventors: Kai-Yang Tung, Taipei (TW); Hung-Ju Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 444 days.

(21) Appl. No.: 17/987,814

(22) Filed: Nov. 15, 2022

(65) Prior Publication Data

US 2024/0090164 A1 Mar. 14, 2024

(30) Foreign Application Priority Data

Sep. 13, 2022 (CN) .......................... 202211111751.1

(51) Int. Cl.
G05D 9/12 (2006.01)
(52) U.S. Cl.
CPC .......... *G05D 9/12* (2013.01); *Y10T 137/4807* (2015.04)
(58) Field of Classification Search
CPC ................ G05D 9/12; Y10T 137/4807; Y10T 137/4857; Y10T 137/7303; Y10T 137/7306; Y10T 137/8342; Y10T 137/86035; H05K 7/20272
See application file for complete search history.

(56) References Cited

U.S. PATENT DOCUMENTS

| | | | | |
|---|---|---|---|---|
| 1,134,636 A | * | 4/1915 | Osbourn | F16K 43/001 137/543.13 |
| 2,966,922 A | * | 1/1961 | Wallis | D06F 43/00 137/263 |
| 7,219,682 B2 | * | 5/2007 | Agnew | F17C 13/084 137/263 |
| 7,631,658 B2 | * | 12/2009 | Graeve, Jr. | E03B 7/075 137/558 |
| 9,811,096 B2 | * | 11/2017 | Hayashi | G05D 11/13 |
| 2010/0219020 A1 | * | 9/2010 | Knox | F16N 13/16 137/565.17 |
| 2013/0213299 A1 | * | 8/2013 | Hu | C23C 16/18 137/565.17 |
| 2021/0015000 A1 | * | 1/2021 | Zhong | H05K 7/20236 |

(Continued)

*Primary Examiner* — Hailey K. Do
(74) *Attorney, Agent, or Firm* — Winston Hsu (57) ABSTRACT

A liquid level controlling apparatus includes a plurality of main sinks, a storage sink, a pump and a connection tube. One of the plurality of main sinks includes a transmission port and a first liquid level detector. The storage sink includes a delivery port and a second liquid level detector. The pump includes an outlet and an inlet. The connection tube includes an rehydration tube and an drain tube. The rehydration tube has a first rehydration section and a second rehydration section. The first rehydration section is connected between the delivery port and the inlet. The second rehydration section is connected between the outlet and the transmission port. The drain tube has a first drain section and a second drain section. The first drain section is connected between the transmission port and the inlet. The second drain section is connected between the outlet and the delivery port.

26 Claims, 4 Drawing Sheets

(56) References Cited

U.S. PATENT DOCUMENTS

| | | | |
|---|---|---|---|
| 2022/0078942 A1* | 3/2022 | Bennett | H05K 7/20281 |
| 2023/0209781 A1* | 6/2023 | Gao | H05K 7/20272 |
| | | | 700/281 |

\* cited by examiner

LIQUID LEVEL CONTROLLING APPARATUS

BACKGROUND OF THE INVENTION

1. Field of the Invention

The present invention relates to a liquid level controlling apparatus, and more particularly, to a liquid level controlling apparatus with preferred liquid level controllability.

2. Description of the Prior Art

The conventional immersion cooling system includes a two-phase cooling system with phase change and a single-phase cooling system without the phase change. The conventional immersion cooling systems need to ensure that the heating component is immersed in the non-conductive liquid; otherwise heat from the heating component cannot be exchanged with the non-conductive liquid for cooling. The liquid level of the cooling liquid in the storage tank of the conventional immersion cooling system is dropped when the heating component is removed from the storage tank; however, if additional cooling liquid is injected into the storage tank, or another heating component with a larger volume is placed in the storage tank, the liquid level of the cooling liquid in the storage tank exceeds an original standard. The liquid level rising phenomenon increases possibility of leaking the cooling liquid. The cooling liquid may easily contact the condenser in the immersion cooling system due to the excessive liquid level, and heat dissipation efficiency of the condenser is decreased accordingly.

For controlling the liquid level in the storage tank, the conventional immersion cooling system disposes a liquid rehydration opening on the bottom of the storage tank, and further disposes a liquid drain opening on the top of the storage tank. The liquid level upper limit gauge and the liquid level lower limit gauge are disposed around the liquid drain opening. If the liquid level in the storage tank is lower than the lower limit of the liquid level, the pump is turned on to inhale the cooling liquid from the liquid rehydration opening; if the liquid level in the storage tank is higher than the upper limit of the liquid level, the cooling liquid is automatically drained from the storage tank through the liquid drain opening due to gravity. However, the heating components with different volumes correspond to different liquid levels of the cooling liquid in the storage tank; position of the liquid level upper limit gauge and the liquid level lower limit gauge is limited to the fixed position of the liquid drain opening, and cannot be flexibly changed in accordance with the heating component with a specific volume in the storage tank.

SUMMARY OF THE INVENTION

The present invention provides a liquid level controlling apparatus with preferred liquid level controllability for solving above drawbacks.

According to the claimed invention, a liquid level controlling apparatus includes a plurality of main sinks, a storage sink, a pump and a connection tube. One of the plurality of main sinks includes a transmission port and a first liquid level detector. The transmission port is disposed on a bottom portion of the first main sink, and the first liquid level detector is disposed on a top portion of the first main sink. The storage sink includes a delivery port and a second liquid level detector. The pump includes an outlet and an inlet. The connection tube is disposed between the first main sink and the storage sink. The connection tube includes a rehydration tube and a drain tube. The rehydration tube includes a first rehydration section and a second rehydration section. Two ends of the first rehydration section are respectively connected to the delivery port and the inlet, and two ends of the second rehydration section are respectively connected to the outlet and the transmission port. The drain tube includes a first drain section and a second drain section. Two ends of the first drain section are respectively connected to the transmission port and the inlet, and two ends of the second drain section are respectively connected to the outlet and the delivery port.

According to the claimed invention, the liquid level controlling apparatus further includes a main sink rehydration controller and a main sink drain controller. The main sink rehydration controller is disposed on the second rehydration section and adapted to control flow between the first main sink and the rehydration tube. The main sink drain controller is disposed on the first drain section adapted to control flow between the first main sink and the drain tube. The liquid level controlling apparatus further includes a storage sink rehydration controller and a storage sink drain controller. The storage sink rehydration controller is disposed on the first rehydration section and adapted to control flow between the storage sink and the rehydration tube. The storage sink drain controller is disposed on the second drain section and adapted to control flow between the storage sink and the drain tube.

The liquid level controlling apparatus of the present invention can design only one delivery port on the storage sink to avoid interference between the cooling liquid drained and inhaled, so as to effectively decrease flow field complexity and increase performance of the pump, and further to prevent the pump from damage resulted from the gaseous matter entering the pump. In addition, the pump of the present invention can simultaneously provide the rehydration function and the drain function for each main sink; if a backup pump is intended to install, the original pump and the backup pump can be changed in series connection or in parallel connection. Comparing to the prior art, the present invention can reduce a number of the pump to decrease hardware cost of the liquid level controlling apparatus. In any possible embodiments of the present invention, the liquid level controlling apparatus of the present invention can be applied to a server, and the server can be used for the artificial intelligence (AI) computation, the edge computing algorithm, and can also be used as the 5G server, the cloud server or internet of vehicles server.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
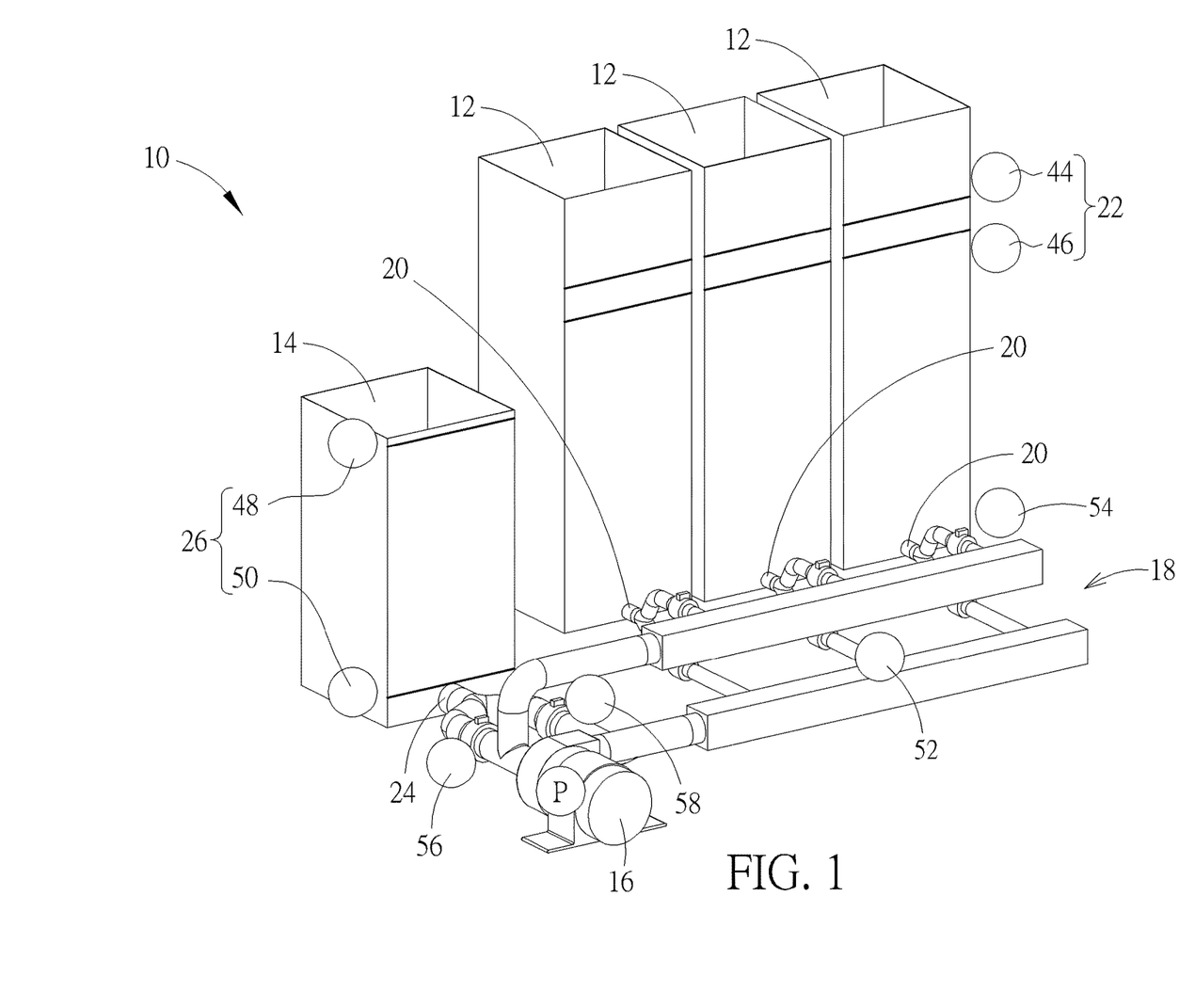
FIG. 1 is a diagram of a liquid level controlling apparatus according to an embodiment of the present invention.
Figure 2:
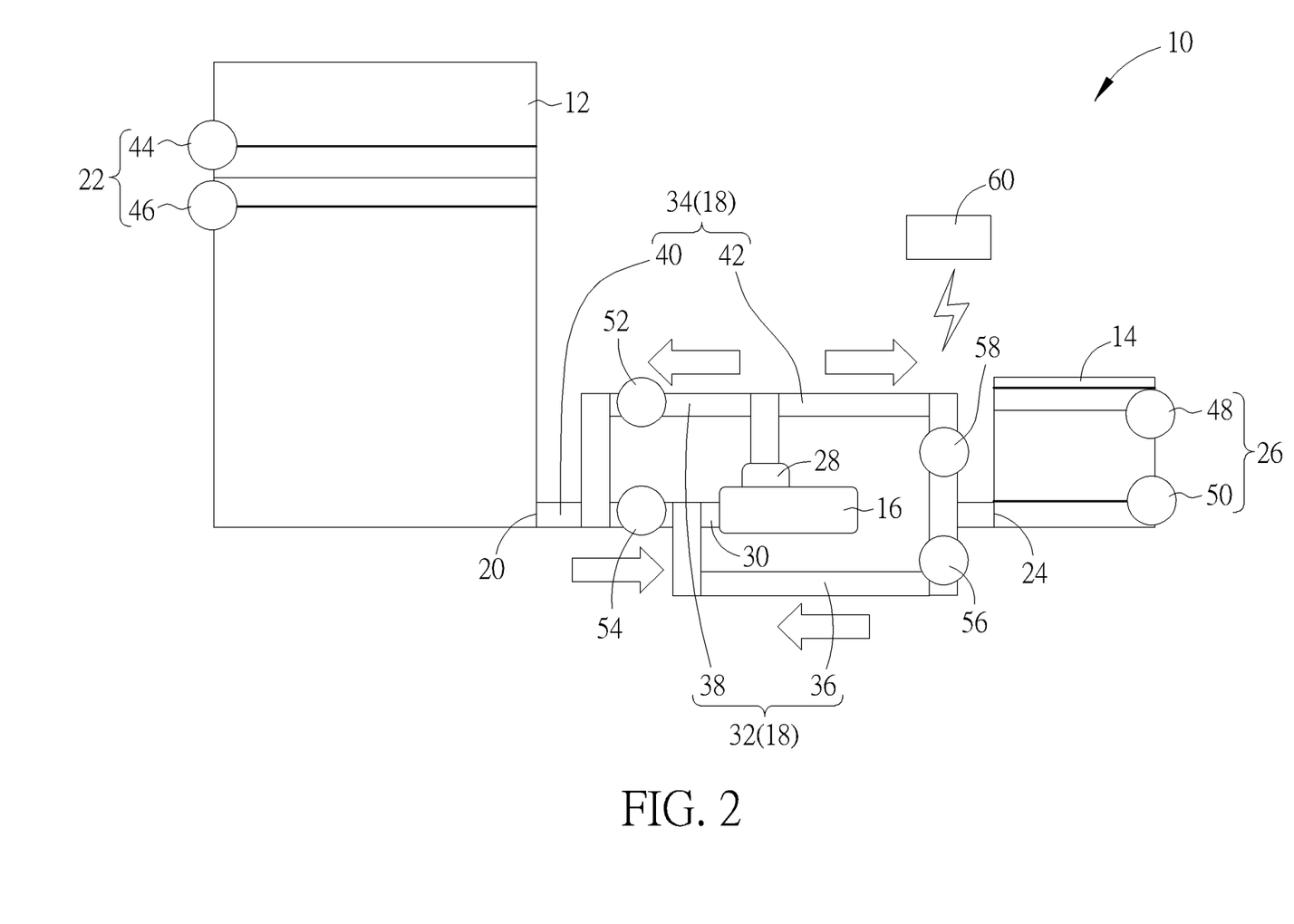
FIG. 2 is a diagram of parts of the liquid level controlling apparatus according to the embodiment of the present invention.

Please refer to FIG. 1 and FIG. 2. FIG. 1 is a diagram of a liquid level controlling apparatus 10 according to an embodiment of the present invention. FIG. 2 is a diagram of parts of the liquid level controlling apparatus 10 according to the embodiment of the present invention. The liquid level controlling apparatus 10 can include main sinks 12, a storage sink 14, a pump 16 and a connection tube 18. Cooling liquid and a heat generation device can be accommodated inside the main sink 12. A number of the main sink 12 can be one or plural. An actual number of the main sink 12 is not limited to the embodiment shown in the figures, and depends on a design demand. The main sink 12 can include a transmission port 20 and a first liquid level detector 22. The transmission port 20 can be disposed on position adjacent to a bottom portion of the main sink 12. The first liquid level detector 22 can be disposed on position adjacent to a top portion of the main sink 12.

The cooling liquid can be further accommodated inside the storage sink 14. The storage sink 14 may transmit the cooling liquid toward the main sink 12, or may receive the cooling liquid drained from the main sink 12. The storage sink 14 can include a delivery port 24 and a second liquid level detector 26. The pump 16 can be disposed between the main sink 12 and the storage sink 14, and include an outlet 28 and an inlet 30. The pump 16 can be connected with the main sink 12 and the storage sink 14 via the connection tube 18. The connection tube 18 can include a rehydration tube 32 and a drain tube 34. The rehydration tube 32 can include further include a first rehydration section 36 and a second rehydration section 38. Two ends of the first rehydration section 36 can be respectively connected to the delivery port 24 and the inlet 30. Two ends of the second rehydration section 38 can be respectively connected to the outlet 28 and the transmission port 20. Besides, the drain tube 34 can further include a first drain section 40 and a second drain section 42. Two ends of the first drain section 40 can be respectively connected to the transmission port 20 and the inlet 30. Two ends of the second drain section 42 can be respectively connected to the outlet 28 and the delivery port 24.

In the embodiment, the first liquid level detector 22 can include a first liquid level gauge 44 and a second liquid level gauge 46, respectively disposed on a high position and a low position inside the main sink 12. For example, a distance of the first liquid level gauge 44 relative to the bottom portion of the main sink 12 can be greater than a distance of the second liquid level gauge 46 relative to the bottom portion of the main sink 12. The first liquid level gauge 44 can detect a liquid level upper limit inside the main sink 12. The second liquid level gauge 46 can detect a liquid level lower limit inside the main sink 12. Position of at least one of the first liquid level gauge 44 and the second liquid level gauge 46 can be changed to adjust setting of the liquid level upper limit and the liquid level lower limit of the main sink 12. The transmission port 20 is disposed adjacent to the bottom portion of the main sink 12, so that position change of the first liquid level gauge 44 and the second liquid level gauge 46 is not affected by the transmission port 20.

In other possible embodiment, the first liquid level detector 22 may be designed as a continuous liquid level gauge. A systematic setting value of the continuous liquid level gauge can be varied to adjust setting of the liquid level upper limit and the liquid level lower limit of the main sink 12; actual position of the first liquid level detector 22 is not changed manually or automatically.

The second liquid level detector 26 can include a first liquid level gauge 48 and a second liquid level gauge 50, respectively disposed on a high position and a low position inside the storage sink 14. For example, a distance of the first liquid level gauge 48 relative to the bottom portion of the storage sink 14 can be greater than a distance of the second liquid level gauge 50 relative to the bottom portion of the storage sink 14. The first liquid level gauge 48 can detect the liquid level upper limit inside the storage sink 14. The second liquid level gauge 50 can detect the liquid level lower limit inside the storage sink 14. A setting manner of the liquid level upper limit and the liquid level lower limit of the storage sink 14 can be similar to ones of the first liquid level detector 22, and a detailed description is omitted herein for simplicity. The second liquid level detector 26 can be designed as the continuous liquid level gauge.

The liquid level controlling apparatus 10 can further include a main sink rehydration controller 52, a main sink drain controller 54, a storage sink rehydration controller 56, a storage sink drain controller 58 and an operation processor 60. The main sink rehydration controller 52 can be disposed on the second rehydration section 38, and used to control flow between the main sink 12 and the rehydration tube 32. The main sink drain controller 54 can be disposed on the first drain section 40, and used to control flow between the main sink 12 and the drain tube 34. The storage sink rehydration controller 56 can be disposed on the first rehydration section 36, and used to control flow between the storage sink 14 and the rehydration tube 32. The storage sink drain controller 58 can be disposed on the second drain section 42, and used to control flow between the storage sink 14 and the drain tube 34.

The operation processor 60 can be electrically connected to the main sink rehydration controller 52, the main sink drain controller 54, the storage sink rehydration controller 56 and the storage sink drain controller 58. The operation processor 60 may be an external processor independent of the liquid level controlling apparatus 10, and can be electrically connected to inner electronic components of the liquid level controlling apparatus 10 in a wire manner or in a wireless manner. Moreover, the operation processor 60 may be a built-in processor of the liquid level controlling apparatus 10. Variation of the operation processor 60 can depend on the design demand, and the detailed description is omitted herein for simplicity. The operation processor can analyze detection results of the first liquid level detector 22 and the second liquid level detector 26, and output a corresponding control command to the main sink rehydration controller 52, the main sink drain controller 54, the storage sink rehydration controller 56 and the storage sink drain controller 58 for driving the pump 16.

The main sink 12 can be connected to the pump 16 via a Y-type tube. Two adjacent ends of the Y-type tube can be respectively connected to the second rehydration section 38 and the first drain section 40. An end of the Y-type tube far from the said two adjacent ends can be connected to the transmission port 20 of the main sink 12. The storage sink 14 can be connected to the pump 16 via another Y-type tube; for example, two adjacent ends of the Y-type tube can be respectively connected to the first rehydration section 36 and the second drain section 42, and an end of the Y-type tube far from the said two adjacent ends can be connected to the delivery port 24 of the storage sink 14. Position of the first liquid level detector 22 relative to the bottom portion of the main sink 12 can be higher than position of the transmission port 20 relative to the bottom portion of the main sink 12, which means the liquid level upper limit and the liquid level lower limit of the main sink 12 can be higher than the transmission port 20. Besides, the liquid level lower limit of the storage sink 14 can be higher than the delivery port 24, to avoid that a gaseous matter is inhaled by the pump 16 and transmitted into the main sink 12 through the rehydration tube 32. The liquid level upper limit of the storage sink 14 can be spaced from an opening of the storage sink 14, to avoid a liquid matter from overflowing from the opening of the storage sink 14.

Figure 3:
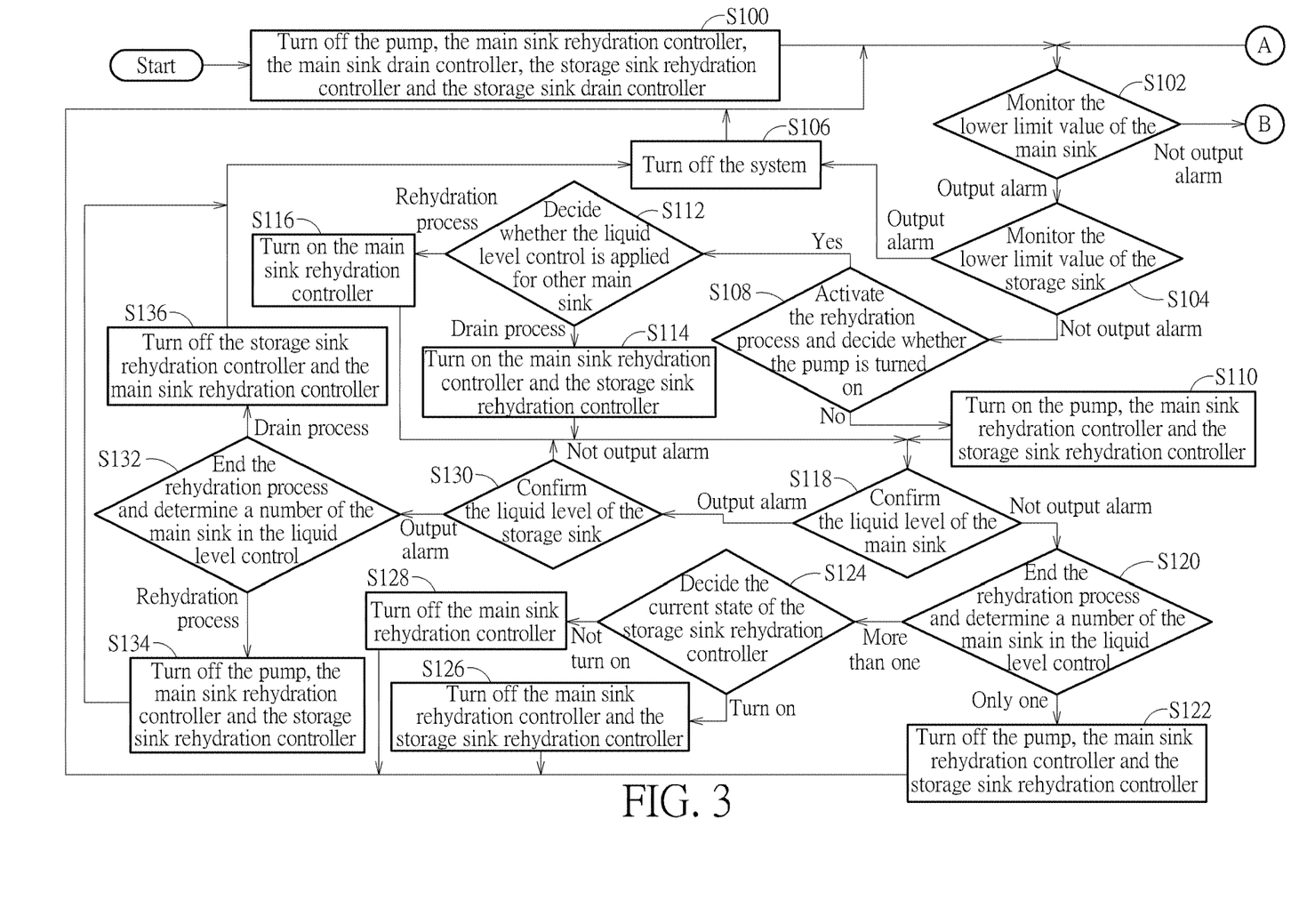
FIG. 3 and FIG. 4 are flow chart of an operation method applied for the liquid level controlling apparatus according to the embodiment of the present invention.
Figure 4:
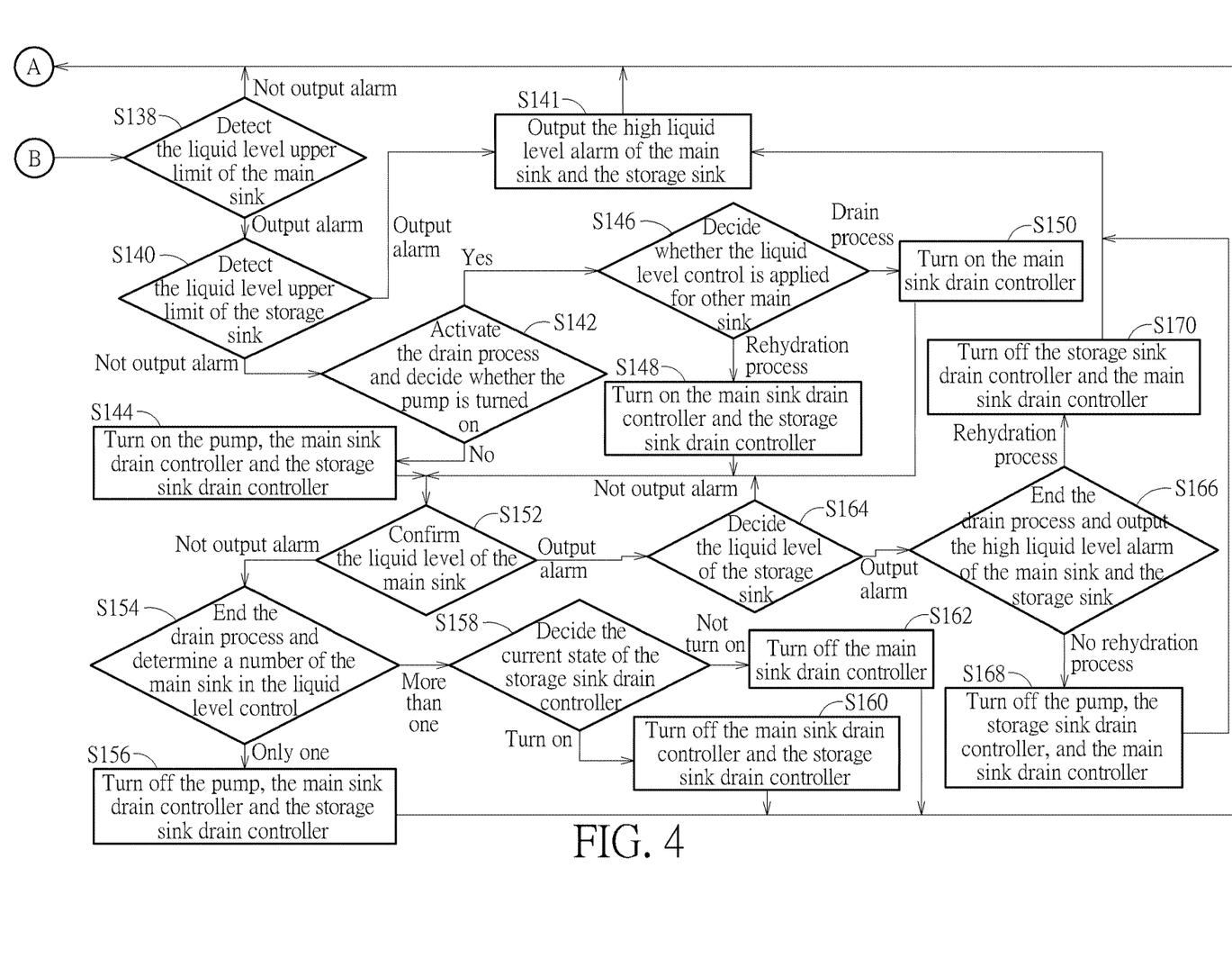

Please refer to FIG. 3 and FIG. 4. FIG. 3 and FIG. 4 are flow chart of an operation method applied for the liquid level controlling apparatus 10 according to the embodiment of the present invention. First, step S100 can be executed to turn off the pump 16, the main sink rehydration controller 52, the main sink drain controller 54, the storage sink rehydration controller 56 and the storage sink drain controller 58, and then set a parameter V3, a parameter V4 and a parameter P equal to zero. The parameter V3 can represent a number of the main sink 12 in liquid level control executed by the storage sink rehydration controller 56. The parameter V4 can represent a number of the main sink 12 in the liquid level control executed by the storage sink drain controller 58. The parameter P can represent a number of the main sink 12 in the liquid level control executed by the pump 16.

Then, step S102 can be executed to monitor a first lower limit value of the main sink 12. If the first liquid level detector 22 outputs a first lower limit alarm, step S104 can be executed to monitor a second lower limit value of the storage sink 14. If the second liquid level detector 26 outputs a second lower limit alarm, step S106 can be executed to turn off the system and output a low liquid level alarm of the main sink 12 and the storage sink 14. If the second liquid level detector 26 does not output the second lower limit alarm, step S108 can be executed to activate a rehydration process and decide states of the storage sink rehydration controller 56 and the pump 16. If the liquid level control is not applied for any main sink 12, step S110 can be executed to turn on the pump 16, the main sink rehydration controller 52 and the storage sink rehydration controller 56, and adjust values of the parameter V3 and the parameter P. If the pump 16 is turned on, step S112 can be executed to decide whether the liquid level control is applied for other main sinks 12. If a drain process is applied for other main sinks 12, step S114 can be executed to turn on the main sink rehydration controller 52 and the storage sink rehydration controller 56, and increase the values of the parameter V3 and the parameter P. If the rehydration process is applied for other main sinks 12, step S116 can be executed to turn on the main sink rehydration controller 52 and increase the values of the parameter V3 and the parameter P.

As the rehydration process is implemented, step S118 can be executed after a while to confirm a liquid level of the main sink 12. If the first liquid level detector 22 does not output the first lower limit alarm, step S120 can be executed to end the rehydration process and read the parameter P. If the parameter P shows the liquid level control is applied for only one main sink 12, step S122 can be executed to turn off the pump 16, the main sink rehydration controller 52 and the storage sink rehydration controller 56, and set the parameter P and the parameter V3 equal to zero. If the parameter P shows the liquid level control is applied for more than one main sink 12, step S124 can be executed to decide a current state of the storage sink rehydration controller 56. If the storage sink rehydration controller 56 is turned on, the liquid level control may be applied for several main sinks 12, but the rehydration process is applied for only one main sink 12, so that step S126 can be executed to turn off the main sink rehydration controller 52 and the storage sink rehydration controller 56, and decrease a value of the parameter P and set the parameter V3 equal to zero. If the storage sink rehydration controller 56 is not turned on, the rehydration process is applied for other main sinks 12, and step S128 can be executed to turn off the main sink rehydration controller 52 and decrease the values of the parameter P and the parameter V3.

If the first liquid level detector 22 still outputs the first lower limit alarm, step S130 can be executed to confirm the liquid level of the storage sink 14. If the second liquid level detector 26 does not output the second lower limit alarm, step S118 can be executed accordingly. If the second liquid level detector 26 outputs the second lower limit alarm, step S132 can be executed to end the rehydration process and compare the parameter P with the parameter V3. If the parameter P is equal to the parameter V3, the rehydration process is only in progress, and step S134 can be executed to turn off the main sink rehydration controller 52 of all the main sinks 12, the pump 16 and the storage sink rehydration controller 56, and set the parameter P and the parameter V3 equal to zero. If the parameter P is not equal to the parameter V3, the drain process may be applied for other main sinks 12, and step S136 can be executed to turn off the storage sink rehydration controller 56 and the main sink rehydration controller 52 of all the main sinks 12, and set the parameter P being equal to the parameter V4.

After execution of step S102, if the first liquid level detector 22 does not output the first lower limit alarm, step S138 can be executed to detect the liquid level upper limit of the main sink 12. If the first liquid level detector 22 does not output the first upper limit alarm, step S102 can be executed accordingly. If the first liquid level detector 22 outputs the first upper limit alarm, step S140 can be executed to detect the liquid level upper limit of the storage sink 14. If the second liquid level detector 26 outputs the second upper limit alarm, step S141 can be executed to output a high liquid level alarm of the main sink 12 and the storage sink 14. If the second liquid level detector 26 does not output the second upper limit alarm, step S142 can be executed to activate the drain process and read the parameter P. If the parameter P is equal to zero, the liquid level control is not applied for any main sink 12, and step S144 can be executed to turn on the pump 16, the main sink drain controller 54 and the storage sink drain controller 58, and adjust the values of the parameter P and the parameter V4. If the pump 16 is turned on, step S146 can be executed to decide whether the liquid level control is applied for other main sinks 14. If the rehydration process is applied for other main sinks 14, step S148 can be executed to turn on the main sink drain controller 54 and the storage sink drain controller 58, and increase the value of the parameter P. If the drain process is applied for other main sinks 14, step S150 can be executed to turn on the main sink drain controller 54 and increase the values of the parameter P and the parameter V4.

As the drain process is implemented, step S152 can be executed after a while to confirm the liquid level of the main sink 12. If the first liquid level detector 22 does not output the first upper limit alarm, step S154 can be executed to end the drain process and analyze the parameter P and the parameter V4. If the parameter P shows the liquid level control is applied for only one main sink 12, step S156 can be executed to turn off the pump 16, the main sink drain controller 54 and the storage sink drain controller 58, and set the values of the parameter P and the parameter V4 equal to zero. If the parameter P shows the liquid level control is applied for more than one main sink 12, step S158 can be executed to decide the current state of the storage sink drain controller 58. If the storage sink drain controller 58 is turned on, the rehydration process is applied for other main sinks 14, and the drain process is applied for only one main sink 14, so that step S160 can be executed to turn off the main sink drain controller 54 and the storage sink drain controller 58, and adjust the parameter P and set the value of the parameter V4 equal to zero. If the storage sink drain controller 58 is not turned on, the drain process is applied for other main sinks 14, and step S162 can be executed to turn off the main sink drain controller 54 and adjust the values of the parameter P and the parameter V4.

If the first liquid level detector 22 outputs the first upper limit alarm, step S164 can be executed to decide the liquid level of the storage sink 14. If the second liquid level detector 26 does not output the second upper limit alarm, step S152 can be executed accordingly. If the second liquid level detector 26 outputs the second upper limit alarm, step S166 can be executed to end the drain process and output the high liquid level alarm of the main sink 12 and the storage sink 14, and then compare the parameter P with the parameter V4. If the parameter P is equal to the parameter V4, the rehydration process is not applied for any main sink 12, and step S168 can be executed to turn off the pump 16, the storage sink drain controller 58, and the main sink drain controller 54 of all the main sinks 12, and then set the values of the parameter P and the parameter V4 equal to zero. If the parameter P is not equal to the parameter V4, the rehydration process may be applied for other main sinks 12, and step S170 can be executed to turn off the storage sink drain controller 58 and the main sink drain controller 54 of all the main sinks 12, and set the parameter P equal to the parameter V3 and the values of the parameter V4 equal to zero. The liquid level control of the liquid level controlling apparatus can be ended until the liquid level of the main sink 12 is set between the liquid level upper limit and the liquid level lower limit.

In conclusion, the liquid level controlling apparatus of the present invention can design only one delivery port on the storage sink to avoid interference between the cooling liquid drained and inhaled, so as to effectively decrease flow field complexity and increase performance of the pump, and further to prevent the pump from damage resulted from the gaseous matter entering the pump. In addition, the pump of the present invention can simultaneously provide the rehydration function and the drain function for each main sink; if a backup pump is intended to install, the original pump and the backup pump can be changed in series connection or in parallel connection. Comparing to the prior art, the present invention can reduce a number of the pump to decrease hardware cost of the liquid level controlling apparatus. In any possible embodiments of the present invention, the liquid level controlling apparatus of the present invention can be applied to a server, and the server can be used for the artificial intelligence (AI) computation, the edge computing algorithm, and can also be used as the 5G server, the cloud server or internet of vehicles server.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A liquid level controlling apparatus comprising:
   a plurality of main sinks, a first main sink of the plurality of main sinks comprising a transmission port and a first liquid level detector, the transmission port being disposed on a bottom portion of the first main sink, and the first liquid level detector being disposed on a top portion of the first main sink;
   a storage sink comprising a delivery port and a second liquid level detector, wherein the second liquid level detector comprises a first liquid level gauge and a second liquid level gauge respectively disposed on a high position and a low position inside the storage sink, and adapted to detect a liquid level upper limit and a liquid level lower limit of the storage sink;
   a pump comprising an outlet and an inlet; and
   a connection tube disposed between the first main sink and the storage sink, the connection tube comprising:
      a rehydration tube comprising a first rehydration section and a second rehydration section, two ends of the first rehydration section being respectively connected to the delivery port and the inlet, two ends of the second rehydration section being respectively connected to the outlet and the transmission port; and
      a drain tube comprising a first drain section and a second drain section, two ends of the first drain section being respectively connected to the transmission port and the inlet, two ends of the second drain section being respectively connected to the outlet and the delivery port.

2. The liquid level controlling apparatus of claim 1, wherein the first liquid level detector comprises a first liquid level gauge and a second liquid level gauge respectively disposed on a high position and a low position inside the first main sink, and adapted to detect a liquid level upper limit and a liquid level lower limit of the first main sink.

3. The liquid level controlling apparatus of claim 1, further comprising:
   a main sink rehydration controller disposed on the second rehydration section and adapted to control flow between the first main sink and the rehydration tube; and
   a main sink drain controller disposed on the first drain section adapted to control flow between the first main sink and the drain tube.

4. The liquid level controlling apparatus of claim 3, further comprising:
   a storage sink rehydration controller disposed on the first rehydration section and adapted to control flow between the storage sink and the rehydration tube; and
   a storage sink drain controller disposed on the second drain section and adapted to control flow between the storage sink and the drain tube.

5. The liquid level controlling apparatus of claim 4, further comprising:
   an operation processor electrically connected to the main sink rehydration controller, the main sink drain controller, the storage sink rehydration controller and the storage sink drain controller, the operation processor being adapted to analyze a detection result of the first liquid level detector and the second liquid level detector, and output a corresponding control command to the main sink rehydration controller, the main sink drain controller, the storage sink rehydration controller and the storage sink drain controller for driving the pump.

6. The liquid level controlling apparatus of claim 5, wherein the operation processor is further adapted to turn on the main sink rehydration controller and the storage sink rehydration controller when determining that the pump is turned on and the storage sink rehydration controller is turned off.

7. The liquid level controlling apparatus of claim 5, wherein the operation processor is further adapted to turn on the main sink rehydration controller when determining that the pump and the storage sink rehydration controller are turned on.

8. The liquid level controlling apparatus of claim 5, wherein the operation processor is further adapted to end a drain process of the plurality of main sinks and output a high liquid level alarm of the first main sink and the storage sink when determining that the first liquid level detector outputs a first upper limit alarm and the second liquid level detector outputs a second upper limit alarm.

9. The liquid level controlling apparatus of claim 8, wherein the operation processor is further adapted to turn off the pump, the main sink drain controller and the storage sink drain controller when determining that a rehydration process is not applied for the first main sink.

10. The liquid level controlling apparatus of claim 8, wherein the operation processor is further adapted to turn off the pump and the storage sink drain controller when determining that a rehydration process is applied for other main sinks except the first main sink.

11. The liquid level controlling apparatus of claim 5, wherein a drain process is applied for the pump when the operation processor determines that the first liquid level detector outputs a first upper limit alarm and the second liquid level detector does not output a second upper limit alarm.

12. The liquid level controlling apparatus of claim 11, wherein the operation processor is further adapted to turn on the pump, the main sink drain controller and the storage sink drain controller when liquid level control is not applied for the plurality of main sinks.

13. The liquid level controlling apparatus of claim 11, wherein the operation processor is further adapted to turn on the main sink drain controller and the storage sink drain controller when determining that a rehydration process is applied for other main sinks except the first main sink.

14. The liquid level controlling apparatus of claim 11, wherein the operation processor is further adapted to turn on the main sink drain controller when determining that the drain process is applied for other main sinks except the first main sink.

15. The liquid level controlling apparatus of claim 11, wherein after the drain process is applied for the pump, the operation processor is further adapted to turn off the drain process when determining that the first liquid level detector does not output the first upper limit alarm.

16. The liquid level controlling apparatus of claim 15, wherein the operation processor is further adapted to turn off the pump, the main sink drain controller and the storage sink drain controller when determining that liquid level control is only applied for one of the plurality of main sinks.

17. The liquid level controlling apparatus of claim 15, wherein the operation processor is further adapted to turn off the main sink drain controller and the storage sink drain controller when determining that the drain process is only applied for one of the plurality of main sinks and the rehydration process is applied for other main sinks except the first main sink.

18. The liquid level controlling apparatus of claim 15, wherein the operation processor is further adapted to turn off the main sink drain controller when determining that the drain process is applied for other main sinks except the first main sink.

19. The liquid level controlling apparatus of claim 5, wherein the operation processor is further adapted to turn on the pump, the main sink rehydration controller and the storage sink rehydration controller when determining that the first liquid level detector outputs a first lower limit alarm, the second liquid level detector does not output a second lower limit alarm and the pump is turned off.

20. The liquid level controlling apparatus of claim 19, wherein after a rehydration process is applied for the pump, the operation processor is further adapted to end the rehydration process and output a low liquid level alarm of the first main sink and the storage sink when determining that the first liquid level detector outputs the first lower limit alarm and the second liquid level detector outputs the second lower limit alarm.

21. The liquid level controlling apparatus of claim 20, wherein the operation processor is further adapted to turn off the pump, the main sink rehydration controller and the storage sink rehydration controller when determining that the rehydration process is applied for the plurality of main sinks.

22. The liquid level controlling apparatus of claim 20, wherein the operation processor is further adapted to turn off the main sink rehydration controller and the storage sink rehydration controller when determining that a drain process is applied for other main sinks except the first main sink.

23. The liquid level controlling apparatus of claim 19, wherein after a rehydration process is applied for the pump, the operation processor is further adapted to end the rehydration process when determining that the first liquid level detector does not output the first lower limit alarm.

24. The liquid level controlling apparatus of claim 23, wherein the operation processor is further adapted to turn off the pump, the main sink rehydration controller and the storage sink rehydration controller when liquid level control is only applied for one of the plurality of main sinks.

25. The liquid level controlling apparatus of claim 23, wherein the operation processor is further adapted to turn off the main sink rehydration controller and the storage sink rehydration controller when the rehydration process is only applied for one of the plurality of main sinks but liquid level control is applied for another main sink.

26. The liquid level controlling apparatus of claim 23, wherein the operation processor is further adapted to turn off the main sink rehydration controller when the rehydration process is applied for other main sinks except the first main sink.

\* \* \* \* \*